(12) United States Patent
Zediker et al.

(10) Patent No.: US 10,656,328 B2
(45) Date of Patent: May 19, 2020

(54) MONOLITHIC VISIBLE WAVELENGTH FIBER LASER

(71) Applicant: NUBURU, INC., Centennial, CO (US)

(72) Inventors: Mark S. Zediker, Castle Rock, CO (US); Matthew Silva Sa, Parker, CO (US); Robert Stegeman, Denver, CO (US); James Tucker, Parker, CO (US); Donald A. Millick, Greenwood Village, CO (US)

(73) Assignee: Nuburu, Inc., Centennial, CO (US)

( * ) Notice: Subject to any disclaimer, the term of this patent is extended or adjusted under 35 U.S.C. 154(b) by 0 days.

(21) Appl. No.: 15/581,263

(22) Filed: Apr. 28, 2017

(65) Prior Publication Data

US 2017/0343729 A1 Nov. 30, 2017

Related U.S. Application Data

(60) Provisional application No. 62/329,660, filed on Apr. 29, 2016.

(51) Int. Cl.

| | |
|---|---|
| *G02B 6/02* | (2006.01) |
| *G02B 6/12* | (2006.01) |
| *H01S 3/067* | (2006.01) |
| *G02B 6/255* | (2006.01) |
| *G02B 6/00* | (2006.01) |

(Continued)

(52) U.S. Cl.
CPC ......... *G02B 6/02128* (2013.01); *G02B 6/00* (2013.01); *G02B 6/12* (2013.01); *G02B 6/2551* (2013.01); *H01S 3/0675* (2013.01); *G02B 2006/12171* (2013.01); *H01S 3/06708* (2013.01); *H01S 3/08063* (2013.01); *H01S 3/09415* (2013.01); *H01S 3/094003* (2013.01); *H01S 3/302* (2013.01); *H01S 5/32341* (2013.01)

(58) Field of Classification Search
CPC ........ G02B 6/12; G02B 6/2551; H01S 3/0675
See application file for complete search history.

(56) References Cited

U.S. PATENT DOCUMENTS

| | | |
|---|---|---|
| 4,288,678 A | 9/1981 | La Rocca |
| 4,679,198 A | 7/1987 | Shone |

(Continued)

FOREIGN PATENT DOCUMENTS

| | | |
|---|---|---|
| CN | 1386608 A | 12/2002 |
| EP | 1437882 | 7/2004 |

(Continued)

OTHER PUBLICATIONS

International Search Report of the International Searching Authority, PCT/US2014/035928, dated Aug. 26, 2014.

(Continued)

*Primary Examiner* — Sung H Pak
*Assistant Examiner* — Hoang Q Tran
(74) *Attorney, Agent, or Firm* — Glen P. Belvis; Belvis Law, LLC.

(57) ABSTRACT

Fiber laser having a monolithic laser resonator having laser affected zones for providing laser beams having wavelengths below 800 nm and from between 400 nm to 800 nm. Methods of using femtosecond lasers to form fiber Bragg gratings, volume Bragg gratings, space gratings, and laser beam delivery patterns for changing the index of refraction within optical fibers.

19 Claims, 15 Drawing Sheets

(51) Int. Cl.
  *H01S 3/08* (2006.01)
  *H01S 3/094* (2006.01)
  *H01S 3/0941* (2006.01)
  *H01S 3/30* (2006.01)
  *H01S 5/323* (2006.01)

(56) References Cited

U.S. PATENT DOCUMENTS

| | | |
|---|---|---|
| 4,879,449 A | 11/1989 | Duley |
| 5,393,482 A | 2/1995 | Benda |
| 5,502,292 A | 3/1996 | Pernicka |
| 5,578,227 A | 11/1996 | Rabinovich |
| 5,987,043 A | 11/1999 | Brown |
| 6,085,122 A | 7/2000 | Manning |
| 6,124,973 A | 9/2000 | Du |
| 6,129,884 A | 10/2000 | Beers |
| 6,940,037 B1 | 9/2005 | Kovacevic |
| 7,001,467 B2 | 2/2006 | Pique |
| 7,034,992 B2 | 4/2006 | Komine |
| 2002/0149137 A1 | 10/2002 | Jang |
| 2003/0063631 A1 | 4/2003 | Corcoran |
| 2004/0094527 A1 | 5/2004 | Bourne |
| 2004/0173587 A1 | 9/2004 | Musselman |
| 2004/0254474 A1 | 12/2004 | Seibel |
| 2005/0103760 A1 | 5/2005 | Kaplan |
| 2006/0160332 A1 | 7/2006 | Gu |
| 2009/0190218 A1 | 7/2009 | Govorkov |
| 2011/0122482 A1 | 5/2011 | Mead |
| 2011/0129615 A1 | 6/2011 | Renn |
| 2011/0170563 A1* | 7/2011 | Heebner ............... H01S 3/067 372/3 |
| 2011/0216792 A1 | 9/2011 | Chann |
| 2011/0259862 A1 | 10/2011 | Scott |
| 2011/0267671 A1 | 11/2011 | Peng |
| 2011/0311389 A1 | 12/2011 | Ryan |
| 2012/0012570 A1 | 1/2012 | Briand |
| 2012/0020631 A1 | 1/2012 | Rinzler |
| 2012/0285936 A1 | 11/2012 | Urashima |
| 2013/0071738 A1 | 3/2013 | Wang |
| 2013/0148673 A1 | 6/2013 | Creeden |
| 2013/0162952 A1 | 6/2013 | Lippey et al. |
| 2013/0269748 A1 | 10/2013 | Wiedeman |
| 2014/0023098 A1 | 1/2014 | Clarkson |
| 2014/0086539 A1 | 3/2014 | Goutain et al. |
| 2016/0067780 A1 | 3/2016 | Zediker |
| 2016/0067827 A1 | 3/2016 | Zediker |
| 2016/0322777 A1 | 11/2016 | Zediker |

FOREIGN PATENT DOCUMENTS

| | | |
|---|---|---|
| RU | 2132761 C1 | 7/1999 |
| RU | 2141881 C1 | 11/1999 |
| RU | 2205733 C2 | 6/2003 |
| WO | 2014179345 A1 | 11/2014 |

OTHER PUBLICATIONS

Written Opinion of the International Searching Authority, PCT/US2014/035928, dated Aug. 26, 2014.
International Preliminary Report on Patentability, PCT/US2014/035928, dated Nov. 3, 2015.
International Search Report of the International Searching Authority, PCT/US2015/047226 dated Jan. 7, 2016.
Written Opinion of the International Searching Authority, PCT/US2015/047226, dated Jan. 7, 2016.
Communication Pursuant to Rules 70(2) and 70a(2) EPC, EP14791734.8, dated Oct. 14, 2016.
Translation of the Official Action, RU015151016/02, dated Mar. 20, 2017.
Translation of the Search Report, RU015151016/02 (078493), Search Completed Mar. 4, 2017.
Extended European Search Report, EP14791734.8, dated Sep. 27, 2016.
Machine Language Translation, 1386608ACN, Dec. 25, 2002.
International Search Report, PCT/US16/42363, dated Dec. 8, 2016.
Written Opinion of the International Searching Authority, PCT/US16/42363, dated Dec. 8, 2016.
Machine Translation, JP2003-340924, Dec. 2, 2003.
Machine Translation, JP2003-206323, Jul. 22, 2003.
Translation of the Abstract, RU2132761C1, Jul. 10, 1999.
Translation of the Abstract, RU2205733C2, Jun. 10, 2003.
U.S. Appl. No. 15/581,928, Pelaprat, filed Apr. 28, 2017.
U.S. Appl. No. 15/581,494, Zediker, filed Apr. 28, 2017.
U.S. Appl. No. 15/581,263, Zediker, filed Apr. 28, 2017.
PCT, Search Report Report PCT/US2017/030175, dated Jul. 13, 2017.

* cited by examiner

MONOLITHIC VISIBLE WAVELENGTH FIBER LASER

This application claims under 35 U.S.C. § 119(e)(1) the benefit of the filing date of U.S. provisional application Ser. No. 62/329,660 filed Apr. 29, 2016, the entire disclosure of which is incorporated herein by reference.

BACKGROUND OF THE INVENTION

Field of the Invention

The present inventions relate to fiber lasers for generating laser beams in the visible, e.g., 400 to 700 nm, wavelength range, and methods of making these lasers. In particular, the present inventions relate to configurations and methods to provide for lasing in a fiber through the placement of laser-formed fiber Bragg gratings (FBG), including femtosecond laser formed FBGs.

In general, an FBG is a typical form of fiber-based device for providing spectral and spatial-spectral wavelength specific feedback. These devices have been employed in fiber lasers that generate laser beams having wavelengths above 1 μm (micron). In fiber laser applications FBGs are typically produced by applying a phase-mask to a specialty photosensitive optical fiber. The core of this optical fiber is generally Ge-doped. When the core of the fiber is exposed to UV light, through the mask, the local index of refraction is changed where the UV light interacts with the Ge atoms in the core. Based upon the pattern of the mask, the index of refraction of the core is changed in a periodic (i.e., predetermined) pattern along a length of the fiber. This periodic modification of the index of refraction along the length of the fiber's core establishes a feedback mechanism, which is spectrally dependent. As such, an FBG can be applied to the ends of an optical fiber to form a standing wave cavity and initiate lasing when the round trip gain of the cavity exceeds the losses of the cavity. As such, a monolithic laser cavity can be created with optical fibers, which have advantages of robustness and reliability due to the self-guiding nature of optical fibers and material qualities of the fiber.

As used herein, unless expressly stated otherwise, "UV", "ultra violet", "UV spectrum", and "UV portion of the spectrum" and similar terms, should be given their broadest meaning, and would include light in the wavelengths of from about 10 nm to about 400 nm, and from 10 nm to 400 nm.

As used herein, unless expressly stated otherwise, the terms "visible", "visible spectrum", and "visible portion of the spectrum" and similar terms, should be given their broadest meaning, and would include light in the wavelengths of from about 380 nm to about 750 nm, and 400 nm to 700 nm.

As used herein, unless expressly stated otherwise, the terms "blue laser beams", "blue lasers" and "blue" should be given their broadest meaning, and in general refer to systems that provide laser beams, laser beams, laser sources, e.g., lasers and diodes lasers, that provide, e.g., propagate, a laser beam, or light having a wavelength from about 400 nm to about 500 nm.

As used herein, unless expressly stated otherwise, the terms "green laser beams", "green lasers" and "green" should be given their broadest meaning, and in general refer to systems that provide laser beams, laser beams, laser sources, e.g., lasers and diodes lasers, that provide, e.g., propagate, a laser beam, or light having a wavelength from about 500 nm to about 575 nm.

Generally, the term "about" as used herein, unless specified otherwise, is meant to encompass a variance or range of ±10%, the experimental or instrument error associated with obtaining the stated value, and preferably the larger of these.

This Background of the Invention section is intended to introduce various aspects of the art, which may be associated with embodiments of the present inventions. Thus the forgoing discussion in this section provides a framework for better understanding the present inventions, and is not to be viewed as an admission of prior art.

SUMMARY

High power, high brightness laser sources in the 300-700 nm range are typically accomplished by frequency doubling of pulsed laser sources which begin in the near infrared. The use of a monolithic cavity involving optical fibers has been prevented, in these wavelength ranges, due to the photo-degradation of fiber-based components, which typically use germanium (Ge) as a photosensitive dopant in processing an optical fiber to provide spectrally and spatially-spectrally dependent feedback and selection.

Thus, there has been a long standing and unfulfilled need for the robustness of monolithic fiber high brightness lasers in the 300 nm to 800 nm wavelength range, and in particular, in the visible wavelength ranges, e.g., 400 nm to 700 nm. The present inventions, among other things, solve these needs by providing the articles of manufacture, devices and processes taught, and disclosed herein.

Thus there is provide a laser resonator for generating a laser beam in the wavelength region of about 400 nm to about 700 nm, the laser resonator having: an optical fiber having a core and a cladding and having an all fiber feed-back mechanism, the feed-back mechanism having a first reflective member and a second reflective member; the first reflective member and the second reflective member located along a length of the optical fiber and defining a distance there between; and, wherein, the second reflective member is a fiber Bragg grating, wherein the fiber Bragg grating is capable of providing feedback to the first Raman order; and wherein the fiber Bragg grating is incapable of providing feedback to the second Raman order.

Further there are provided laser systems, and laser having these laser resonator as their lasing component; and such systems where there one, two, three, four, five or more, ten or more, and 50 or more, laser resonators in the laser system. These multi-component systems can be independent, coupled, on the same fiber, on different fibers and combinations and variations of these.

There are further provided these resonators, systems, lasers and methods having one or more of the following features: wherein the fiber Bragg grating is created in the optical fiber using femtosecond pulses to operate in the wavelength region of 400-700 nm; wherein the wavelength is within the wavelength range of light and is less than 800 nm; wherein the core is pure fused silica core and the fiber Bragg grating is located in the core; wherein the core is a phosphorous doped core and the fiber Bragg grating is located in the core; wherein the core is not doped with photosensitive dopants, whereby the core is free from photosensitive dopants; and the laser resonator is capable of producing a laser beam at wavelengths below about 500 nm; and wherein the fiber Bragg grating is inscribed at normal incidence to the optical wave direction in the optical fiber; thereby providing feedback within the core of the optical fiber Still further there is provided a Fiber Bragg grating that provides feedback at a specific wavelength within the Raman gain spectrum.

Yet additionally, there is provide a fiber Bragg grating wherein the fiber Bragg grating is a fiber-coupled volume Bragg grating.

Moreover there is provided a laser resonator for generating a laser beam in the wavelength region of about 400 to about 700 nm, the laser resonator having: an optical fiber having a core and a cladding and having an all fiber feed-back mechanism, the feed-back mechanism having a first reflective member and a second reflective member; the first reflective member and the second reflective member located along a length of the optical fiber and defining a distance there between; and, wherein, the second reflective member is a fiber Bragg grating, wherein the fiber Bragg grating is capable of providing feedback over an entire order of a Raman gain spectrum.

There are further provided these resonators, systems, lasers and methods having one or more of the following features: wherein the fiber Bragg grating is a fiber-coupled volume Bragg grating; wherein the fiber Bragg grating is a fiber-coupled volume Bragg grating; wherein the fiber Bragg grating is inscribed at an angle with respect to the normal of the optical wave direction in the optical fiber; whereby the fiber Bragg grating is capable of redirecting the propagating mode out of the core of the fiber; wherein the fiber Bragg grating is inscribed with a curved shape with respect to the normal of the optical wave direction in the optical fiber; whereby the fiber Bragg grating is capable of redirecting only n modes back into the core of the fiber, where n can vary from 1 to <4; wherein the fiber Bragg grating is inscribed in a pure fused silica core fiber; wherein the fiber Bragg grating is inscribed in a pure fused silica core fiber; herein the fiber Bragg grating is inscribed in a phosphorous doped core of a fiber; wherein the fiber Bragg grating is inscribed in a doped core; wherein the core is not doped with photosensitive dopants, whereby the core is free from photosensitive dopants; and the laser resonator is capable of producing a laser beam at wavelengths below about 500 nm; wherein the fiber Bragg grating is capable of providing loss over n Raman orders where n can vary from 2 to >10; wherein the fiber Bragg grating is a fiber-coupled volume Bragg grating; wherein the fiber-coupled volume Bragg grating is created using femtosecond laser pulses; wherein the fiber Bragg grating is a fiber-coupled volume Bragg grating and is created in glass; wherein the fiber Bragg grating is a fiber-coupled volume Bragg grating; and wherein the fiber-coupled volume Bragg grating is inscribed at normal incidence to the optical wave direction in glass; whereby the fiber-coupled volume Bragg grating is capable of providing feedback within the core of the optical fiber; wherein the fiber Bragg grating is a fiber-coupled volume Bragg grating; wherein the fiber-coupled volume Bragg grating is inscribed at an angle with respect to the normal of the optical wave direction in the optical fiber; whereby the fiber-coupled Bragg grating is capable of redirecting the propagating mode out of the core of the fiber; and, wherein the fiber Bragg grating is a fiber-coupled volume Bragg grating; wherein the fiber-coupled volume Bragg grating is inscribed with a curved shape with respect to the normal of the optical wave direction in the optical fiber; whereby the fiber-coupled Bragg grating is capable of redirecting only n modes back into the core of the fiber, where n can vary from 1 to <4.

In addition there is provide a laser resonator for generating a laser beam in the wavelength region of about 400 to about 700 nm, the laser resonator having: an optical fiber having a core and a cladding and having an all fiber feed-back mechanism, the feed-back mechanism having a first reflective member and a second reflective member; the first reflective member and the second reflective member located along a length of the optical fiber and defining a distance there between; and, wherein, the second reflective member is a fiber Bragg grating, wherein the fiber Bragg grating is capable of providing loss to a second Raman order.

Still additionally, there is provide a laser resonator for generating a laser beam in the wavelength region of about 400 to about 700 nm, the laser resonator having: an optical fiber having a core and end cap, and a cladding and having an all fiber feed-back mechanism, the feed-back mechanism having a first reflective member located in the fiber, and a second reflective member located in the end cap; the first reflective member and the second reflective member located along a length of the optical fiber and defining a distance there between; and, wherein, the second reflective member is a Bragg grating, wherein the Bragg grating is capable of providing feedback to a Raman order.

There are further provided these resonators, systems, lasers and methods having one or more of the following features: wherein the first reflective member is a fiber Brag grating, wherein the first reflective member is a volume Brag grating; and wherein the first reflective member is a space grating, There are further provided these resonators, systems, lasers and methods having one or more of the following features: wherein the Bragg grating is capable of providing feed back to the first Raman order; wherein the Bragg grating is incapable of providing feedback to the second Raman order; wherein the Bragg grating is incapable of providing feedback to the second Raman order; wherein the Bragg grating is written into the fiber optic endcap at a normal incidence to an optical wave direction, wherein the Bragg grating is curved to match the NA of the optical fiber, whereby the Bragg grating provides feedback within the core of the optical fiber; and wherein the Bragg grating provides feedback at a specific wavelength within a Raman gain spectrum; wherein the Bragg grating provides feedback over an entire Raman gain spectrum.

In addition there is provided a volume Bragg grating written into a fiber optic endcap connected to an optical fiber; wherein the volume Bragg grating provides loss to a Raman order. A dielectric coating on the face of the optic endcap connected to an optical fiber can be sufficiently narrow band to provide feedback on the n=1 Raman order but no feedback for the n=2 or higher Raman order. A resonator can be a combination of a dielectric coating for one reflector and a volume Bragg grating for the other reflector.

There are further provided these resonators, systems, lasers and methods having one or more of the following features: wherein the volume Bragg grating is inscribed at an angle with respect to the normal of an optical wave direction in the optical fiber to redirect a propagating mode out of a core of the fiber; wherein the fiber optic endcap is glass; wherein the fiber optic endcap is a glass that is not doped with photosensitive dopants, thereby being free from photosensitive dopants, and is capable of generating laser beams at wavelengths below about 500 nm.

Moreover there is provide a laser resonator for generating a laser beam in the wavelength region of about 400 to about 700 nm, the laser resonator having: an optical fiber having a core and a cladding and having an all fiber feed-back mechanism, the feed-back mechanism having a first reflective member located in the fiber, and a second reflective member located in the optical fiber; the first reflective member and the second reflective member located along a length of the optical fiber and defining a distance there between; and, wherein, the second reflective member is a nanostructured moth eye grating.

There are further provided these resonators, systems, lasers and methods having one or more of the following features: wherein the nanostructured moth eye grating is capable of providing feedback to a Raman order; wherein the nanostructured moth eye grating is capable of providing feedback to a first Raman order; wherein the nanostructured moth eye grating is incapable of providing feedback to second Raman order; wherein the nanostructured moth eye grating is incapable of providing feedback to a second Raman order; wherein the nanostructured moth eye grating is created in glass on the end of the optical fiber; wherein the nanostructured moth eye grating is positioned at normal incidence to an optical wave direction in the fiber, and thereby is capable of providing feedback within the core of the optical fiber; wherein the nanostructured moth eye grating is capable of providing feedback at a specific wavelength within a Raman gain spectrum; wherein the nanostructured moth eye grating is capable of providing feedback over the entire Raman gain spectrum; wherein the nanostructured moth eye grating is capable of providing loss to the second Raman order; wherein the nanostructured moth eye grating is positioned at an angle with respect to a normal of an optical wave direction in the optical fiber, and thereby capable of redirecting the propagating mode out of the core of the fiber; wherein the wavelengths for the nanostructured moth eye grating is from 400 nm to 500 nm; wherein the nanostructured moth eye grating is capable of providing loss over n Raman orders where n can vary from 2 to >10.

Still further there is provide a fiber laser for providing a laser beam having a wavelength less than 800 nm, the laser having: a laser resonator having first an optical fiber, a pump laser input end, and a laser beam output end; the optical fiber having a core and a cladding; and, the laser beam output end having a laser affected zone having an index of refraction different from an index of refraction of the core, the laser affected zone defining a Bragg grating, for transmitting a laser beam having a predetermined wavelength, and reflecting a predetermined range of wavelengths, wherein the predetermined range does not include the wavelength of the transmitted laser beam.

In addition there are further provided these resonators, systems, lasers and methods having one or more of the following features: wherein the laser resonator is a monolithic fiber laser resonator; wherein the laser beam output end is a volume Bragg grating; wherein the output end is a fiber Bragg grating; wherein the transmitted laser beam wavelength is from about 400 nm to about 600 nm; wherein the transmitted laser beam wavelength is from about 400 nm to about 500 nm; wherein the transmitted laser beam wavelength is from about 425 nm to about 475 nm; wherein the transmitted laser beam wavelength is 457 nm; wherein the transmitted laser beam wavelength is 466 nm.

Moreover there is provide a method of making a fiber laser resonator, the method having: providing an optical fiber; treating an area of the optical fiber with a pulsed laser beam having a pulse width of less than 10 pico second, whereby a laser affected zone is formed in the optical fiber having a changed index of refraction; there by defining a fiber Bragg grating; wherein the fiber Bragg grating is wavelength selective to transmit a wavelength in the range of from about 400 nm to about 700 nm.

There are further provided these resonators, systems, lasers and methods having one or more of the following features: wherein the pulse width is less than 1 pico second; and, wherein the laser affected zone is essentially free of photosensitive dopants.

Further there is provide a method of making a fiber laser resonator, the method having: providing an optical fiber; treating an area of the optical fiber with an index of refraction modifying agent, whereby a laser affected zone is formed in the optical fiber having a changed index of refraction; there by defining a fiber Bragg grating; wherein the fiber Bragg grating is wavelength selective to transmit a wavelength in the range of from about 400 nm to about 700 nm.

Additionally, there are provided these resonators, systems, lasers and methods having one or more of the following features: wherein the index of refraction modifying agent is a chemical agent; wherein the index of refraction modifying agent is a thermal treatment; wherein the index of refraction modifying agent is an electromagnetic radiation beam; wherein the electromagnetic radiation beam is an excimer laser beam, and the fiber Bragg grating is induced by deep UV radiation provided by excimer lasers; and, wherein the electromagnetic radiation beam is an X-ray beam, and wherein the fiber Bragg grating is induced by exposure of the optical to fiber to X-rays.

Furthermore there is provided a laser resonator for generating a laser beam in the wavelength region of about 400 to about 700 nm, the laser resonator having: an optical fiber having a core and end cap, and a cladding and having an integrated feed-back mechanism, the feed-back mechanism having a first reflective member located in the fiber, and a second reflective member located at the surface of the end cap; the first reflective member located along a length of the optical fiber and defining a distance there between; and, wherein, the second reflective member is a dielectric coating, wherein the dielectric coating is capable of providing feedback to the first Raman order, wherein the second reflective member is a dielectric coating, wherein the dielectric coating does not provide feedback to the n=2 Raman order.

Still further there is provided a laser resonator for generating a laser beam in the wavelength region of about 400 to about 700 nm, the laser resonator having: an optical fiber having a core and end cap, and a cladding and having an integrated feed-back mechanism, the feed-back mechanism having a first reflective member located at the face of the endcap, and a second reflective member located in the fiber; the second reflective member located along a length of the optical fiber and defining a distance there between; and, wherein, the second reflective member is a Bragg grating, wherein the Bragg grating is capable of providing feedback to the first Raman order.

Additionally there is provided a laser resonator for generating a laser beam in the wavelength region of about 400 to about 700 nm, the laser resonator having: an optical fiber having a core and end caps, and a cladding and having an integrated feed-back mechanism, the feed-back mechanism having a first reflective member located at the face of one end cap, and a second reflective member located on the face of the other end cap; the first reflective member and the second reflective member located along a length of the optical fiber and defining a distance there between; and, wherein, the second reflective member is narrow band dielectric coating, wherein the dielectric coating is capable of providing feedback to the first Raman order.

There is also provided these resonators, systems and methods having one or more of the following features: wherein, the second reflective member is a narrow band dielectric coating, wherein the dielectric coating does not provide feedback to the second Raman order or any other Raman orders from n>1 to xx; where in the first reflective member is a narrowband dielectric coating that provides feedback to the first Raman order, and is a low reflective coating at the pump wavelength; wherein the first and second reflective members are dielectric coatings which provide feedback to the first Raman order, and are both low reflective coatings the pump wavelength; wherein the first and second reflective members are dielectric coatings which provide feedback to n Raman orders where n >1 to xxx; wherein the first and second reflective members are dielectric coatings which provide feedback ton Raman orders where n >1 to n=10; and, wherein the first and second reflective members are dielectric coatings which provide feedback to the first Raman order, the first dielectric coating is low reflectivity for the pump wavelength, and the second dielectric coating is a high reflectivity for the pump wavelength providing a second pass for the pump wavelength through the resonator to improve the conversion efficiency of the laser.

DESCRIPTION OF THE PREFERRED EMBODIMENTS

Figure 1:
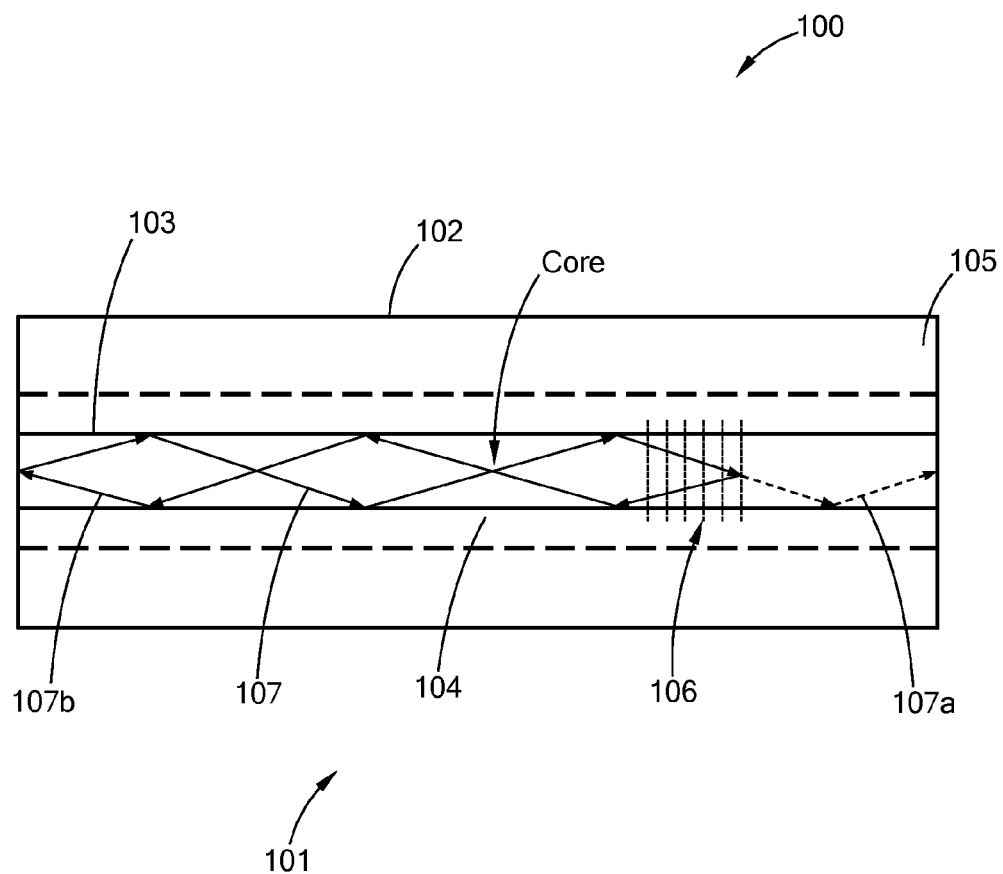
FIG. 1 is a schematic cross sectional view of an embodiment of an end of a monolithic laser resonator in accordance with the present inventions.

In general, embodiments of the present inventions relate to monolithic laser resonators in optical fibers. The monolithic laser resonators have one, and preferably two integral FBGs formed from the fiber to create the ends of the lasing resonator.

Generally, in embodiments of the present inventions reflective members are formed at areas along a length of an optical fiber. The reflective members can be wavelength specific, reflecting a particular wavelength range from broad (e.g., reflection wave length ranges in the hundreds of nanometers) it can be wavelength limiting, (e.g. reflecting wavelengths greater than x nm, reflecting wavelengths lower than y nm) or it can be narrow (e.g., reflecting wavelengths is tens of nanometers and less).

Preferably, in embodiments of the monolithic fiber lasing resonator, the lasing resonator has at least one, and preferably both, end reflective members that are integrally formed from the fiber. In a most preferred embodiment, one and preferably both of the reflective members are formed in the fiber, to create the ends of the laser resonator, by the use of a femto second laser. The femto second laser provides a pattern of laser shots to the fiber to modify, e.g., change, the optical properties, e.g., refractive index, of the material in the fiber to create from the fiber reflective member, e.g., FBG, at the ends of the lasing resonator.

In general, the fibers for use in the monolithic lasing resonator can have a core and a first, a second or more cladding layers around the core. The cores can be made from optically transparent media and have diameters from about 0.1 µm to about 1000 µm. In a preferred embodiment the core is made from glass and has a diameter of about 50 µm. The cladding layer can be made from glass and have a thickness (distance, e.g., cross section, from the inner surface of the layer to the outer surface of the layer) of about 15 µm to 500 µm. In a preferred embodiment cladding layer (in a multi-cladding layer embodiment, the inner most layer) is made from glass and has a thickness of 25 µm.

In a preferred embodiment the preferred core and the preferred cladding layer are utilized.

Embodiments of the monolithic fiber laser resonators can be about 0.1 cm to about 100 cm, a few meters in length, and 1000 meters or more. Preferably the monolithic fiber laser resonators are less than about 50 meters. However, longer and shorter laser resonators are contemplated.

The femto second laser formed FBG can be about 0.1 mm in length to about 500 mm in length. In embodiments of the laser resonator the following table provides examples of embodiments of resonator to provide different laser Table 1 provides several examples of embodiments of the present laser systems.

TABLE 1

| Pump Laser | | Monolithic laser resonator | | | | Out put laser | |
|---|---|---|---|---|---|---|---|
| wavelength | Power Watts | Inlet FBG length | Resonator length | Core diameter | Outlet FBG length | wavelength | Power Watts |
| 405 nm | 200 | 10 mm | 30 m | 50 | 10 mm | 413 nm | 50 |
| 532 nm | 200 | 10 mm | 30 m | 50 | 10 mm | 543 nm | 50 |

TABLE 1-continued

| Pump Laser | | Monolithic laser resonator | | | | Out put laser | |
|---|---|---|---|---|---|---|---|
| wavelength | Power Watts | Inlet FBG length | Resonator length | Core diameter | Outlet FBG length | wavelength | Power Watts |
| 355 nm | 200 | 10 mm | 30 m | 50 | 10 mm | 360 nm | 50 |
| 445 nm | 200 | 10 mm | 30 m | 50 | 10 mm | 453 nm | 50 |
| 405 nm | 200 | 10 mm | 30 m | 50 | 10 mm | 427 nm | 50 |
| 532 nm | 200 | 10 mm | 30 m | 50 | 10 mm | 571 nm | 50 |
| 355 nm | 200 | 10 mm | 30 m | 50 | 10 mm | 372 nm | 50 |
| 445 nm | 200 | 10 mm | 30 m | 50 | 10 mm | 472 nm | 50 |
| 532 nm | 200 | 10 mm | 5 m | 50 | 10 mm | 553 nm | 50 |
| 793 nm | 1000 | 10 mm | 1 m | 50 | 10 mm | 808 nm | 50 |

The FBGs formed in the fiber to provide the ends of the lasing resonator are preferably made treating the fiber with the delivery of femto second laser beam in a predetermined pattern and at predetermined energy levels. The laser energy as delivered by the delivery pattern provides for changes in the optical properties of the fiber. This provides for the ability to have custom, and varying, FBGs at either end of the laser resonator. For example, the laser shot pattern can have varying shot density with the length of the fiber, thus providing gradually changing optical properties over the length of the FBG. These changing properties can be uniformly changing, staggered, varying, essentially non-periodic, periodic and other combinations and variations.

Figure 8A:
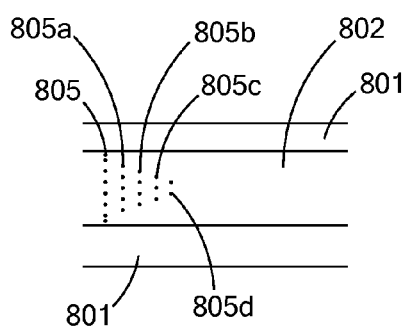
FIG. 8A to 8D are cross sectional views of laser beam shot patterns for making FBG in accordance with the present inventions.
Figure 8B:
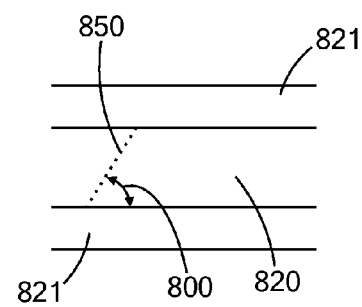

Turning to FIGS. 8A to 8D there are shown cross sectional drawings of fibers having embodiments of laser delivery patents, and laser affected areas. In FIG. 8A there is shown a fiber having a core 802 and cladding 801. The laser delivery pattern has a decreasing density of laser shots per line, when viewed from shot pattern line 805, 805a, 805b, 805c, to 805d. Other patterns having varying shot density are contemplated. Additionally, density can be varied along the length of the axis of the fiber, and radially from the center of the fiber, and combinations and variations of this. Turning to FIG. 8B there is shown a fiber having a core 820 and cladding 821 having a line of laser shots 850 that is placed at an angle 800 to the longitudinal axis of the fiber. This angle can be from 0 to 179 degrees.

Figure 8C:
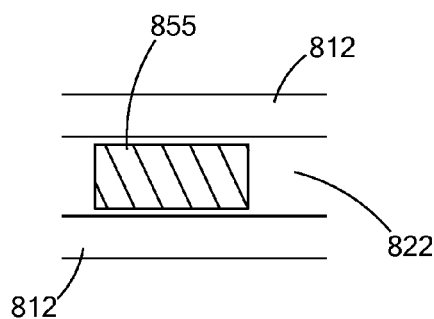
Figure 8D:
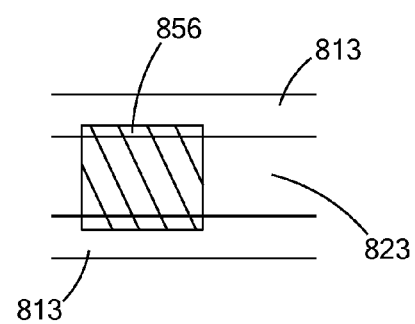

Turning to FIG. 8C there is shown a cross section of fiber having a core 822 and a cladding 812. The fiber has a laser affected zone 855, in which the laser shot pattern, as delivered, has changed the optical properties of the material. In FIG. 8C the laser affected zone, e.g., area, 856 is entirely within the core 823. In the embodiment of FIG. 8D the laser affected zone 856 is in the core 823 and extends into the cladding 813. It should be understood that, in particular with the use of femto second lasers, the laser effect zone, will be essentially the same as, in identical to the area where the laser shot pattern is directed. However, depending upon shot density, energy and delivery time, the laser affected zone could be larger or smaller than the area where the shot pattern is delivered.

In an embodiment, a second order stokes suppression can be achieved via modifying the resonator, or inserting another fiber component anywhere in the resonator.

In an embodiment of the laser resonator consist of an all-fiber feedback mechanisms in optical fibers for use in the 300 nm to 800 nm wavelength range and in particular in the 400 nm-700 nm wavelength range. A periodic structure is induced in the core of an optical fiber using a femtosecond, high intensity laser to create a FBG. The periodic structure is obtained by modifying the refractive index of the glass by high intensity laser light. The periodic refractive index change allows for spectral selection of specific wavelength bands in the 400-700 nm wavelength range for use in an n-order Raman fiber laser. The spectral selection is placed anywhere in the 400-700 nm spectral window to provide feedback or growth at the wavelength of interest.

The feedback provided by the FBG allows laser oscillation to create an n-order fiber Raman laser, as shown in FIG. 1. FIG. 1 is a cross section schematic view of an embodiment of a laser resonator 100 of a Raman laser 101. The resonator 100 has an optical fiber 102, having a core 103 and a cladding 104, and an outer cladding 105. The resonator 100 has a reflective member, in this embodiment a FBG 106. The resonator 100 has a second reflective member not shown in the figure, but located to the left along the length of the optical fiber 102, a distance away from the FBG. The propagation of the laser is shown by dashed lines 107a, while the path of the forward and reflected light is shown by arrows 107 and 107b respectively.

Figure 2:
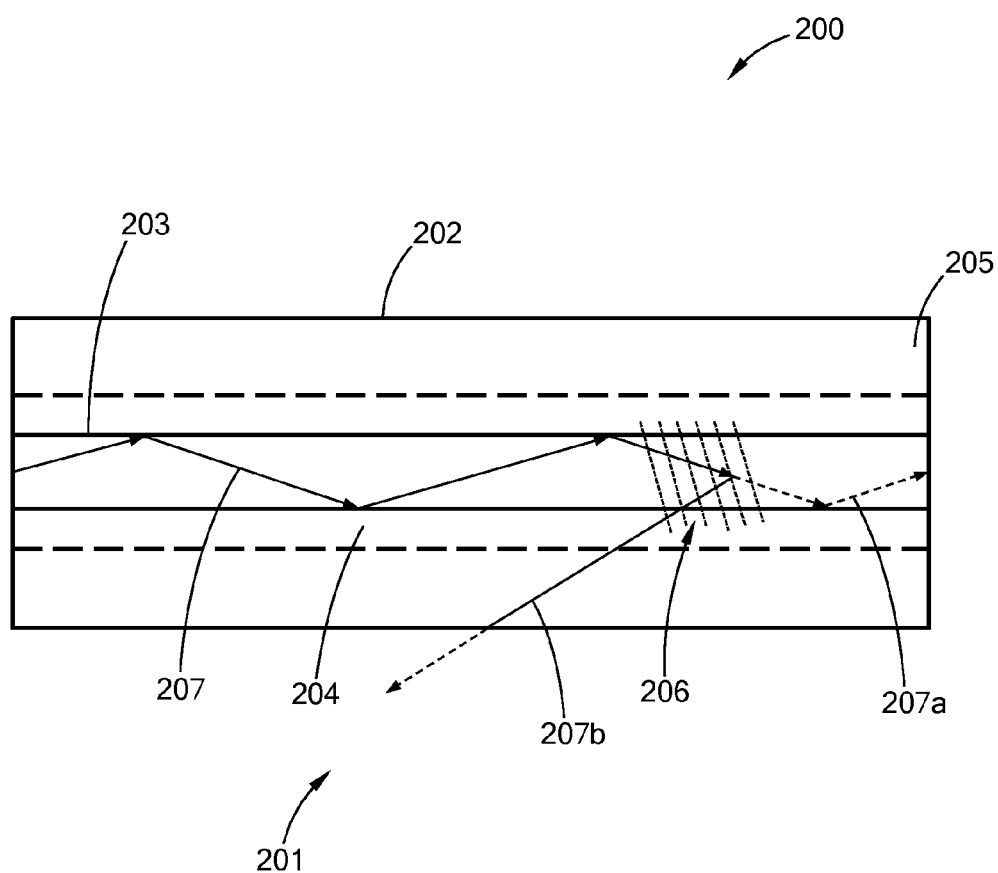
FIG. 2 is a schematic cross sectional view of an embodiment of an end of a monolithic laser resonator in accordance with the present inventions.

Additionally, in an embodiment of the laser resonator, the growth of the "n+1"-order Raman mode can be suppressed by tilting the FBG such that energy at the "n+1"-order Raman mode is ejected from the fiber core, as shown in FIG. 2. This suppression allows for the n-order Raman mode to increase in energy beyond the traditional power limit. In this embodiment, it is noted that the laser patent is extending into the cladding.

Turning to FIG. 2 there is provided is a cross section schematic view of an embodiment of laser resonator 200 of a Raman laser 201. The resonator 200 has an optical fiber 202, having a core 203 and a cladding 204, and an outer cladding 205. The resonator 200 has a reflective member, in this embodiment an angled FBG 206. The resonator 200 has a second reflective member not shown in the figure, but located to the left along the length of the optical fiber 202, a distance away from the FBG 206. The propagation of the laser is shown by dashed lines 207a, while the path of the forward and reflected light is shown by arrows 207 and 207b respectively. Noting that the manner in which the FBG is inscribed, e.g., positioned in the core and cladding and with respect to the axis of the optical fiber provides for the reflected light 706b to exit the core. The resonator has a second reflective member not shown in the figure, but located to the left along the length of the optical fiber, a distance away from the FBG.

Additionally, although shown in cross section as a line or lines in the figures, it is understood that the laser pattern is typically a disc shape, i.e., a long the lines of the rod line fiber, to follow the exterior of the core area where the pattern is delivered, or to fill the core area, if so intended. The shape of the pattern does not necessarily have to be disc shape, half discs, vertical lines, planes, triangles, cones, and other shapes, and combinations and variations of these can be used. Further, if the fiber, and the fiber core are not round, e.g. square, then the laser beam delivery pattern can be of the same shape as that fiber, e.g. square, to follow the shape of the fiber, it that is so intended.

Figure 3:
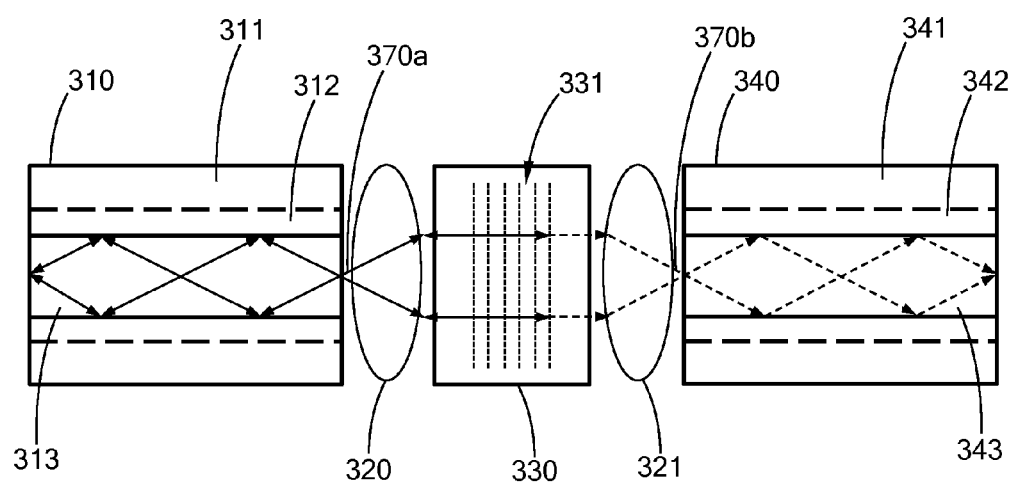
FIG. 3 is a schematic cross sectional view of an embodiment of a fiber-based VBG configuration, placed at the end of a monolithic laser resonator in accordance with the present inventions.

In an embodiment a volume Bragg grating (VBG) is also used in place of the section of optical fiber where the fiber Bragg grating is written directly into the optical fiber, as shown in FIG. 3. Thus, this embodiment has a first optical fiber section 310, having an outer cladding 311, an inner cladding 312 and a core 313. A lens, assembly of lens 320 is located in the optical path between the fiber 310 and an optical member 330 having the VGB 331 inscribed in the member 330. A lens 321 is located between the VGB 331 and a second optical fiber section 340, having an outer cladding 341, an inner cladding 342 and a core 343. Light (shown by arrows) is coupled in (arrows 370a forward and reflected) and out (arrows 370b, laser propagation) of the VBG 331 with appropriate lenses 320, 321. The incoming and exiting light is guided into an optical fiber, which constitutes a fiber-couple device. The fiber-coupled VBG is spliced on to the input and output of a Raman active fiber, achieving the same results as using a fiber Bragg grating. The resonator has a second reflective member not shown in the figure, but located to the left along the length of the optical fiber 310, a distance away from the VBG.

Figure 4:
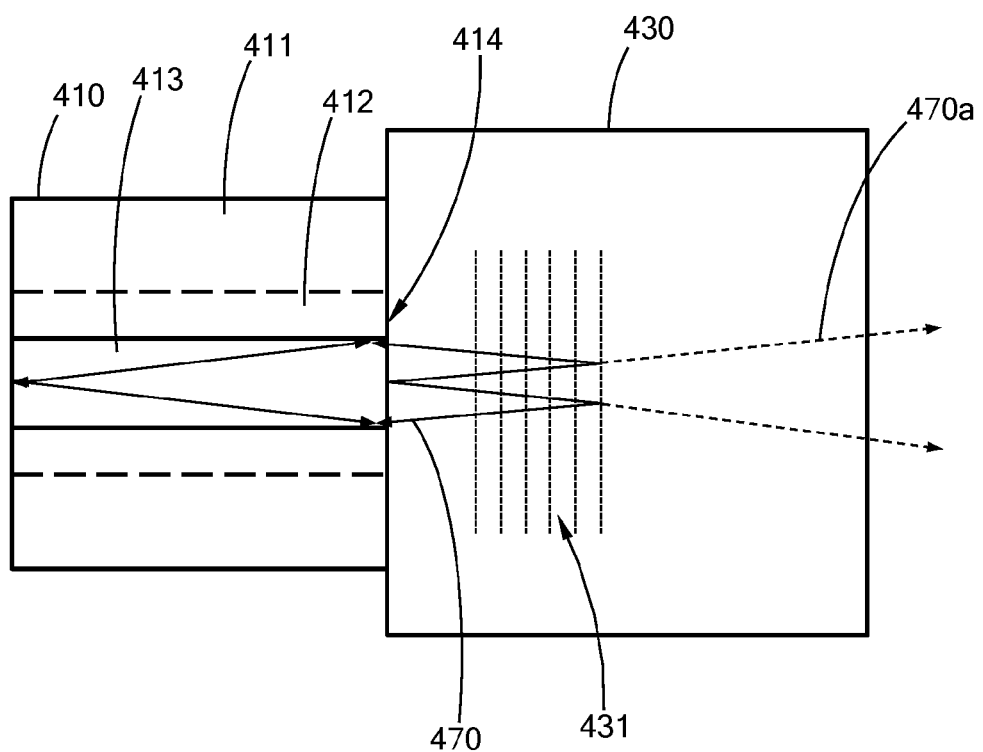
FIG. 4 is a schematic cross sectional view of an embodiment of an end of a laser resonator in accordance with the present inventions.

In an embodiment a volume Bragg grating is written (e.g., is formed by creating a laser affected area of the core, the cladding or both) into a piece of glass end cap to provide feedback in the manners discussed above, as shown in FIG. 4. Thus, this embodiment has an optical fiber section 410, having an outer cladding 411, an inner cladding 412 and a core 413. The face of the optical fiber 414 is in mechanical and optical contact, e.g., fused to, an optical member 430, e.g., a glass end cap. A VGB 431 inscribed in the member 430. Light (shown by arrows) is coupled in and out (arrows 470,) of the VBG 431 and propagated from (arrows 470a). Thus, the configuration of FIG. 4 can form one end or both ends of a fiber laser resonator.

Figure 5:
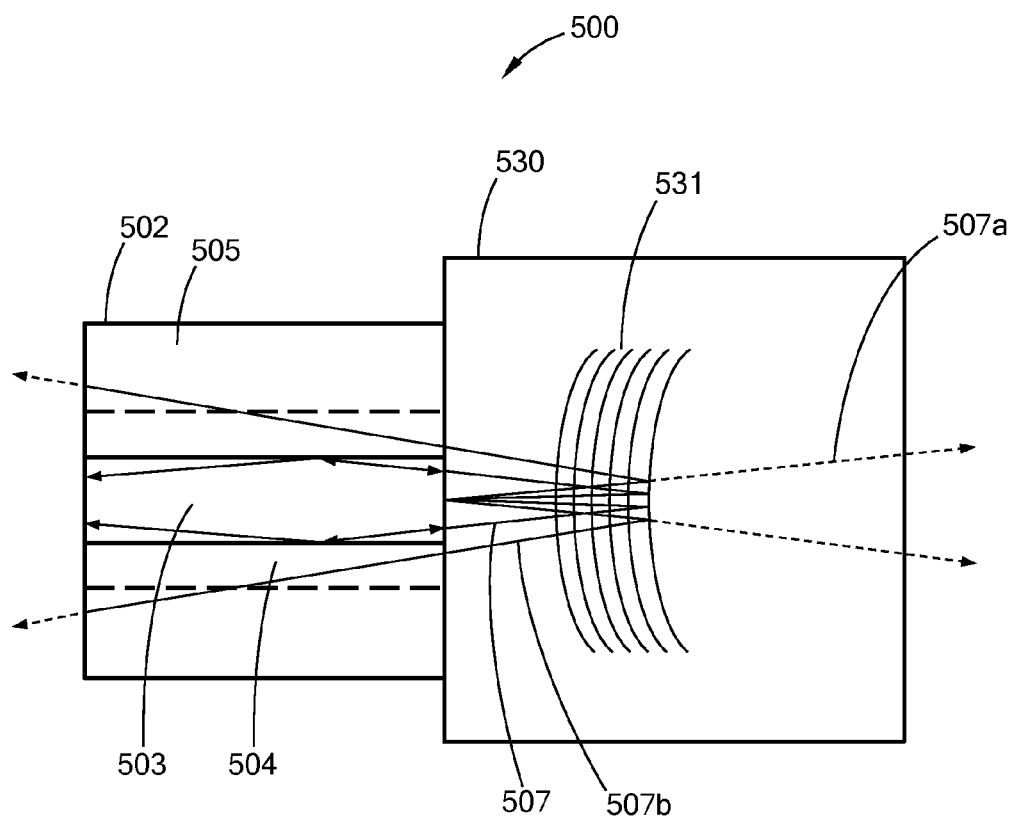
FIG. 5 is a schematic cross sectional view of an embodiment of an end of a laser resonator in accordance with the present inventions.

The FBG or VBG can be written with a curved surface with respect to the normal of the light propagation direction to reflect the lower order modes, as shown in the embodiment of FIG. 5. Turning to FIG. 5 there is provided is a cross section schematic view of an embodiment of a reflective member 500 for a laser resonator of a laser. The reflective member 500 has an optical fiber 502, having a core 503 and an inner cladding 504, and an outer cladding 505. The reflective member 500 has an optical member 530, e.g., a glass end cap, that has VGB 531 inscribed or written in a curved shape. The propagation of the laser is shown by dashed lines 507a, while the path of the forward and reflected light is shown by arrows 507, which remains in the core, and the path of reflected light that is directed out of the core, e.g., never enters the core, is shown by arrows 507b.

Figures 6, 6A:
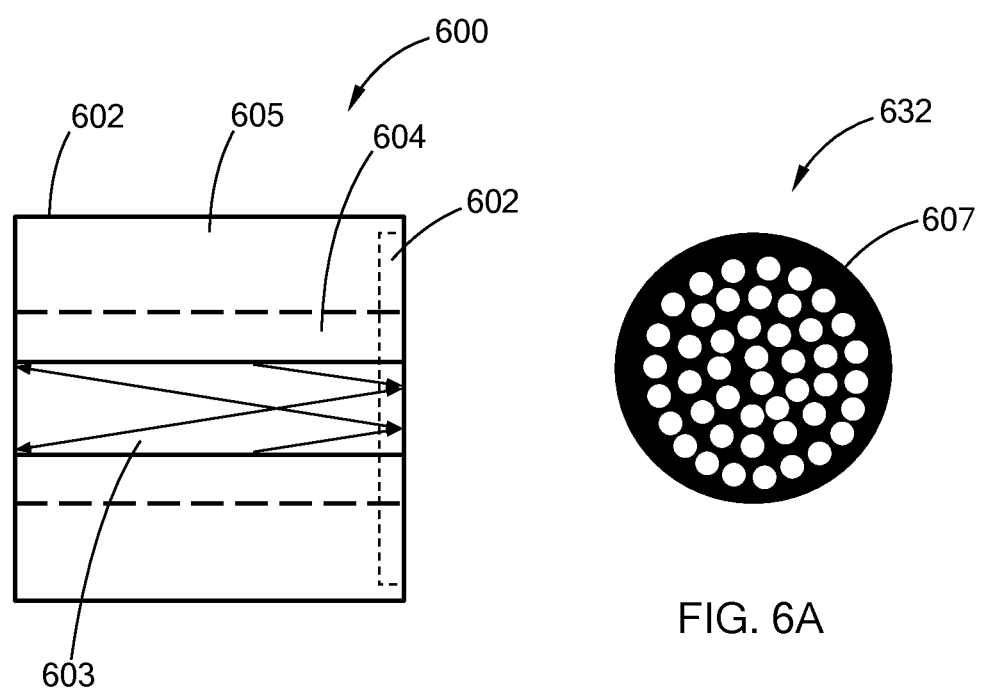
FIG. 6 is a schematic cross sectional view of an embodiment of a monolithic laser resonator in accordance with the present inventions.
FIG. 6A is a plan view of the laser resonator of FIG. 6.

The embodiment shown in FIGS. 6 and 6A, is a staggered or dispersed pattern, such as a "moth eye" laser beam delivery pattern, can be delivered directly onto the end of an optical fiber, to create a moth eye pattern laser affected zone, and to provide feedback, e.g., reflections, in the manners discussed above, as well as, in embodiments the propagation of laser beams. Thus, turning to FIG. 6 the is shown a cross section schematic view of an embodiment of a reflective member 600 for a laser resonator of a laser. The reflective member 600 has an optical fiber 602, having a core 603 and an inner cladding 604, and an outer cladding 605. The laser effect zone 630 is placed in the end of the fiber 602. And in this embodiment, for example, on the fiber face 607. It being understood that in embodiments it could be located at other points within the fiber 602. Turning to FIG. 6A, there is shown a plan schematic view of the fiber face 607 showing the moth eye pattern 631.

In FIGS. 1 to 6, there are shown only section of optical fibers, these drawings are only schematics, it being understood that the fiber actual length is longer, and in embodiments much longer, e.g., orders of magnitude, and several orders of magnitude longer than depicted in the figures.

The all-fiber feedback mechanisms allow for an all-fiber n-order, preferably monolithic, Raman fiber laser to be constructed.

FIGS. 7A to 7F. There is shown a series of graphs depicting the modeled internal power of a laser resonator and the other factors shown for an embodiment of a Raman standing wave & output optical powers.

Figure 7A:
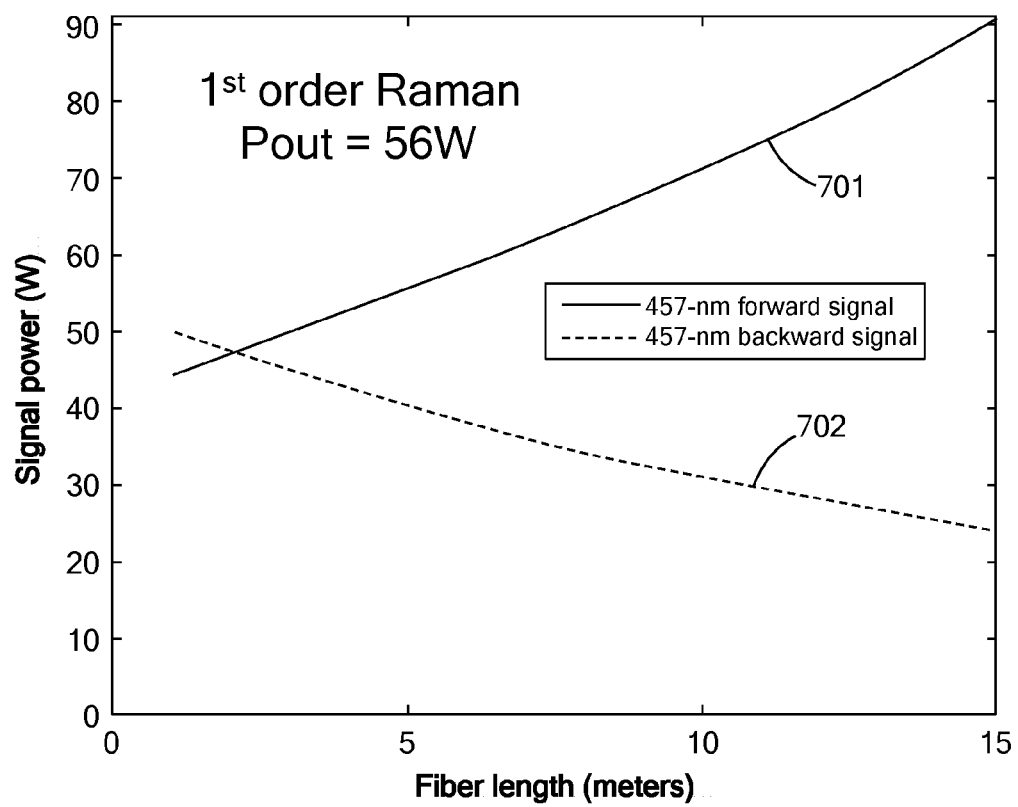
FIGS. 7A to 7F are graphs showing varies calculated internal laser resonator power as a function of various conditions and Raman orders in accordance with the present inventions.

In FIG. 7A there is graphed the Signal power in watts (W) against the Fiber length in meters, with additional loss for $1^{st}$ order Raman ($2^{nd}$ order Raman loss of 0 dB). The $1^{st}$ Order Raman Power out is 56 W. Curve 701 is for 457 nm forward signal, and curve 702 is for 457 nm backward signal.

Figure 7B:
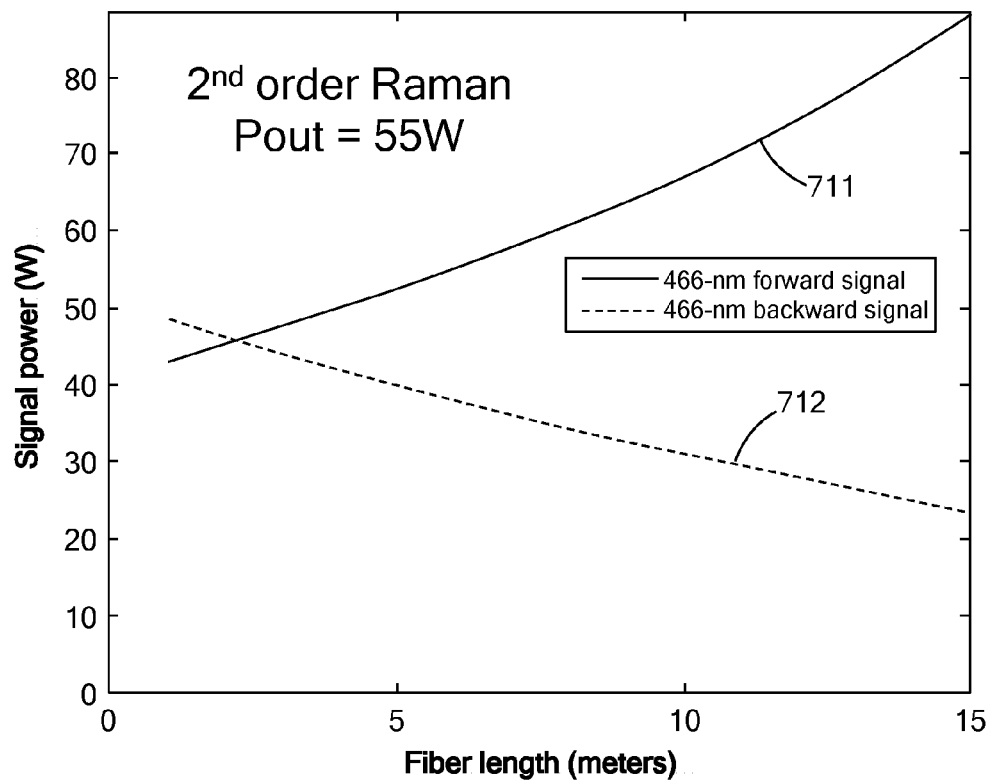

In FIG. 7B there is graphed the Signal power in watts (W) against the Fiber length in meters, for $2^{nd}$ order Raman ($2^{nd}$ order Raman loss of 0 dB). The $2^{nd}$ Order Raman Power out is 55 W. Curve 711 is for 466 nm forward signal, and curve 712 is for 466 nm backward signal.

Figure 7C:
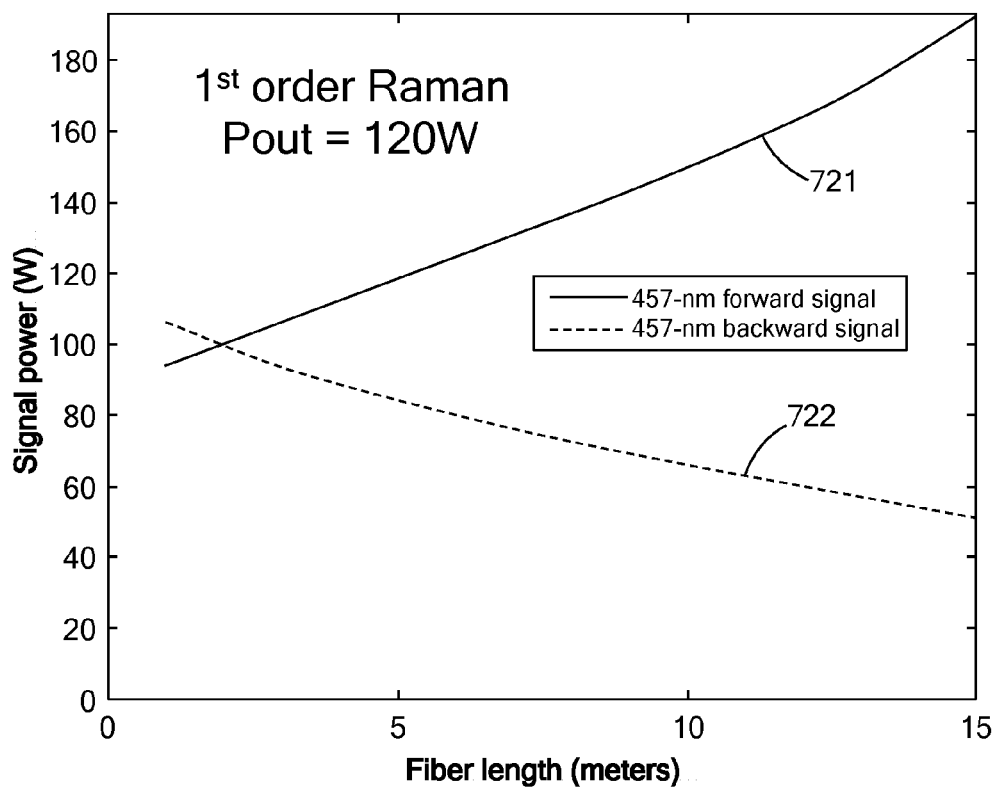

In FIG. 7C there is graphed the Signal power in watts (W) against the Fiber length in meters, for $1^{st}$ order Raman ($2^{nd}$ order Raman loss of 6 dB). The $1^{st}$ Order Raman Power out is 120 W. Curve 721 is for 457 nm forward signal, and curve 722 is for 457 nm backward signal.

Figure 7D:
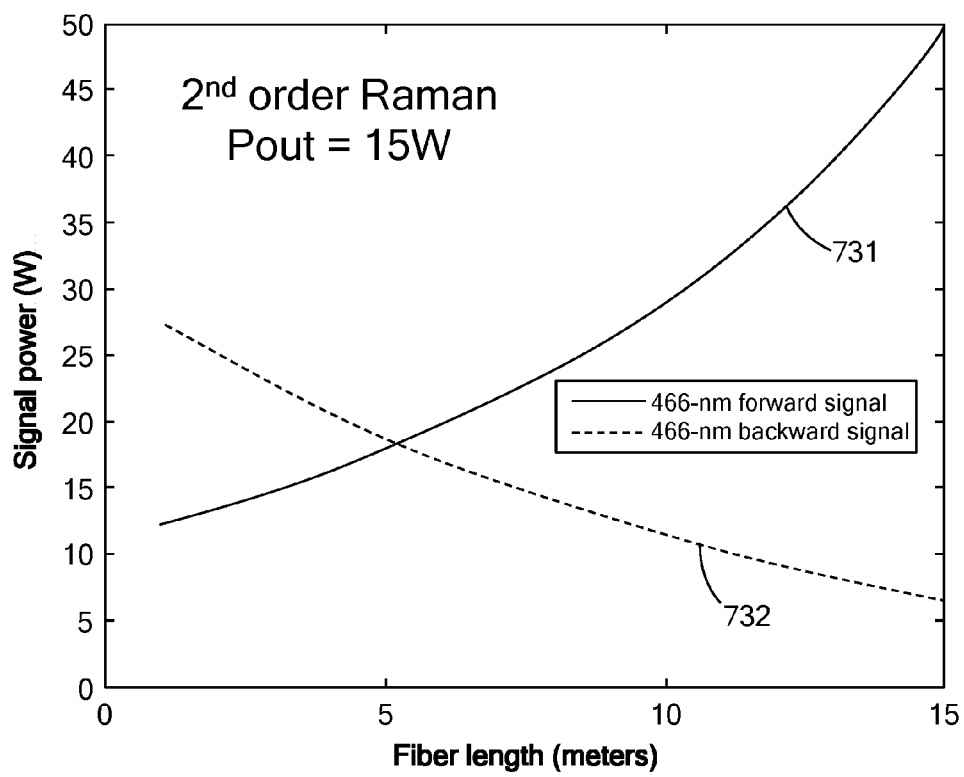

In FIG. 7D there is graphed the Signal power in watts (W) against the Fiber length in meters, for $2^{nd}$ order Raman ($2^{nd}$ order Raman loss of 6 dB). The $2^{nd}$ Order Raman Power out is 15 W. Curve 731 is for 466 nm forward signal, and curve 732 is for 466 nm backward signal.

Figure 7E:
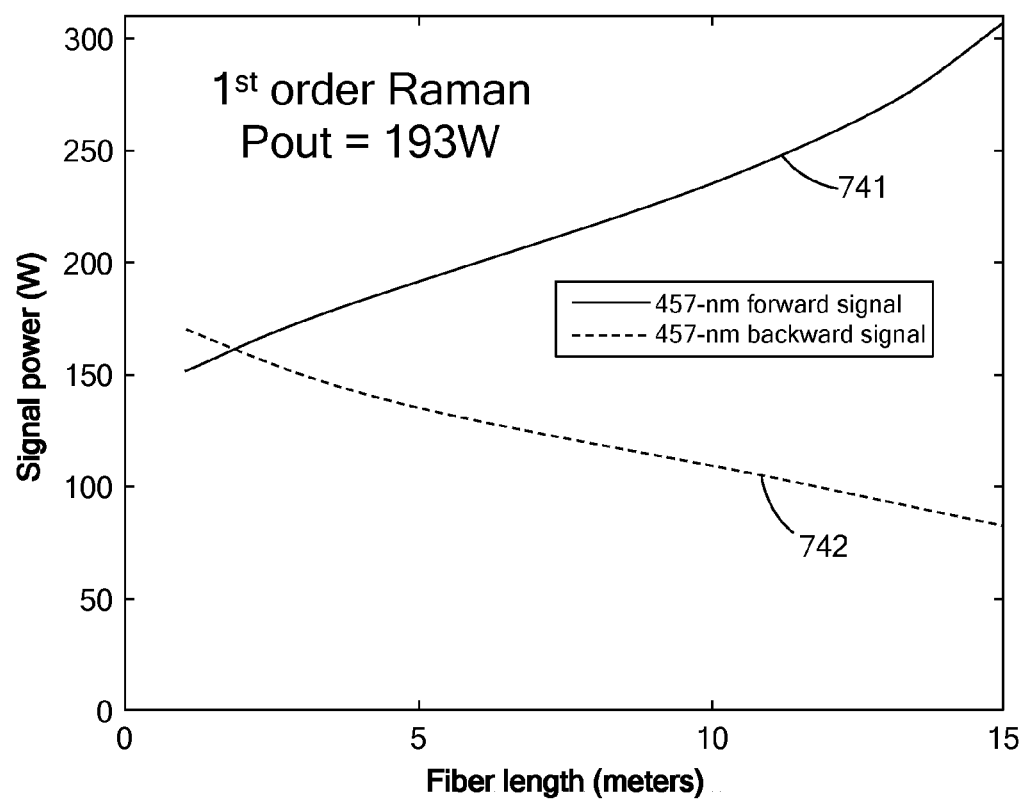

In FIG. 7E there is graphed the Signal power in watts (W) against the Fiber length in meters, for $1^{st}$ order Raman ($2^{nd}$ order Raman loss of 13 dB). The $1^{st}$ Order Raman Power out is 193 W. Curve 741 is for 457 nm forward signal, and curve 742 is for 457 nm backward signal.

Figure 7F:
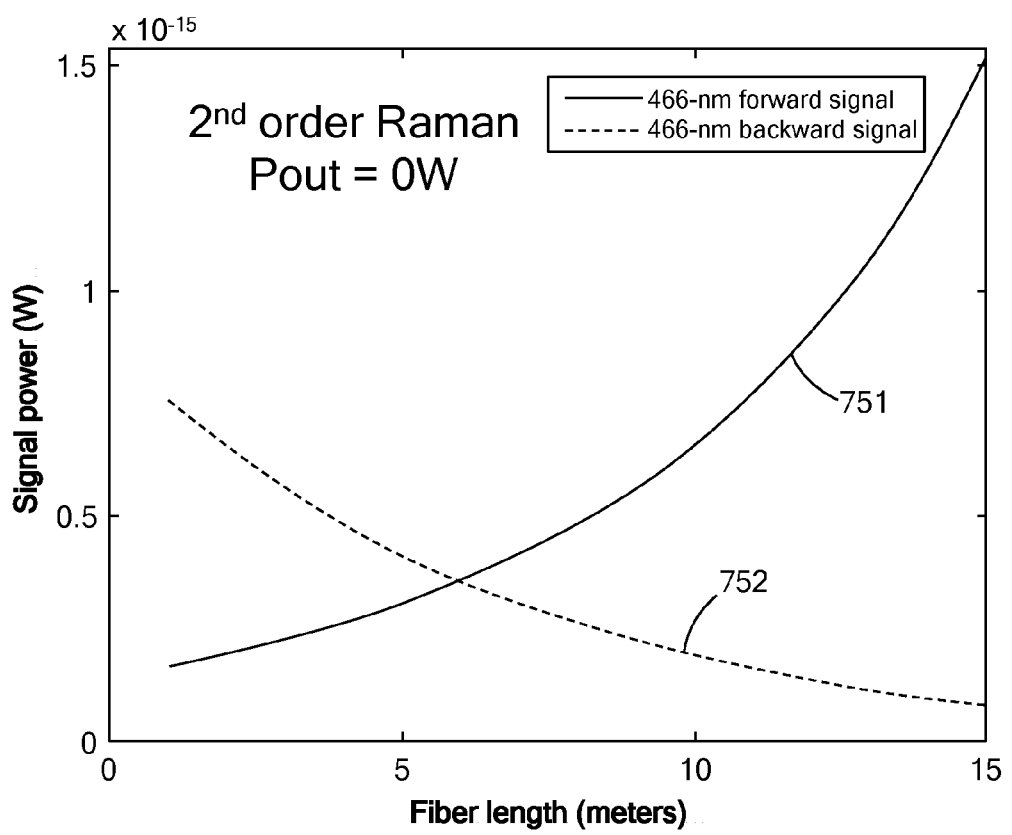

In FIG. 7F there is graphed the Signal power in watts (W) against the Fiber length in meters, for $2^{nd}$ order Raman ($2^{nd}$ order Raman loss of 13 dB). The $2^{nd}$ Order Raman Power out is 0 W. Curve 751 is for 466 nm forward signal, and curve 752 is for 466 nm backward signal.

Figure 9:
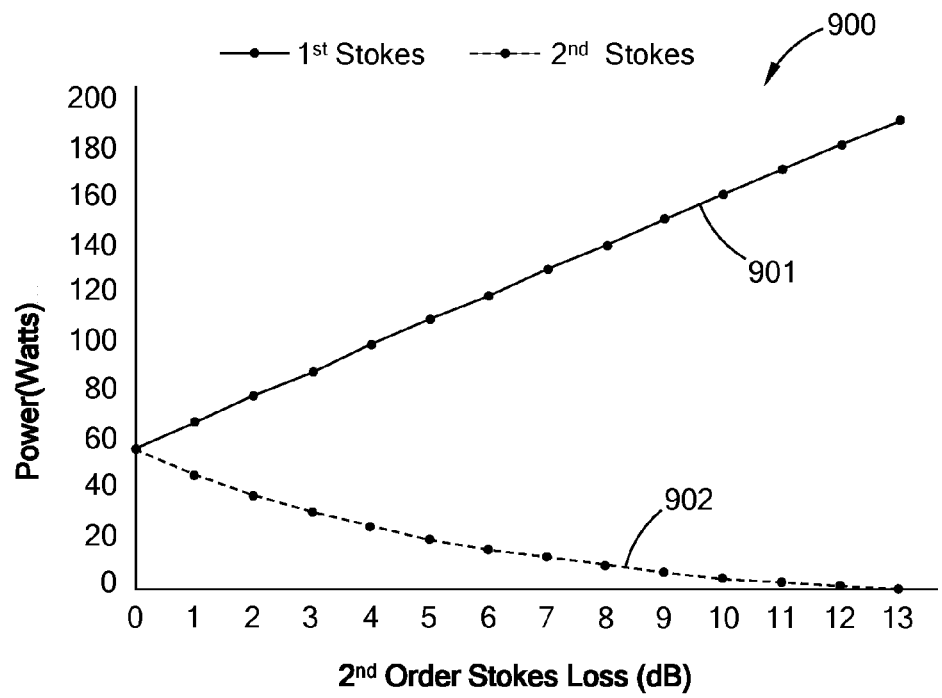
FIG. 9 is a graph showing the laser performance in accordance with the present inventions.

Turning to FIG. 9 there is provided a graph 900 of the output power in watts of the $1^{st}$ and $2^{nd}$ order Raman stokes lines 901, 902 respectively, as a function of additional loss (in dB) at the $2^{nd}$ order Raman stokes line in the laser cavity. Thus, this graph depicts the suppression of $2^{nd}$ order Raman lasing by increasing the loss within the laser resonator at the $2^{nd}$ order Raman Stokes line. The standing wave power within the fiber Raman laser are shown.

Figure 10:
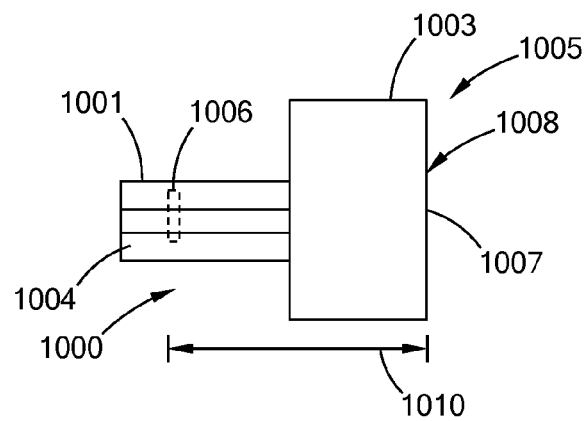
FIG. 10 is a cross section schematic view of an embodiment where the reflective members are dielectric coatings in accordance with the present inventions.

Turning to FIG. 10 there is shown a cross section view of an embodiment of a laser resonator 1000 for generating a laser beam in the wavelength region of about 400 to about 700 nm. The laser resonator has an optical fiber 1001 comprising a core 1002 and end cap 1003, and a cladding 1004 and having an integrated feed-back mechanism 1005, the feed-back mechanism 1005 has a first reflective member 1006 located in the fiber, and a second reflective member 1007 located at the surface 1008 of the end cap 1003; the first reflective member located along a length of the optical fiber and defining a distance 1010 there between. The second reflective member 1007 is a dielectric coating that provides feedback to a Raman order and preferably to the first Raman order, and that does not provide feedback to the to the n=2 Raman order.

Figure 11:
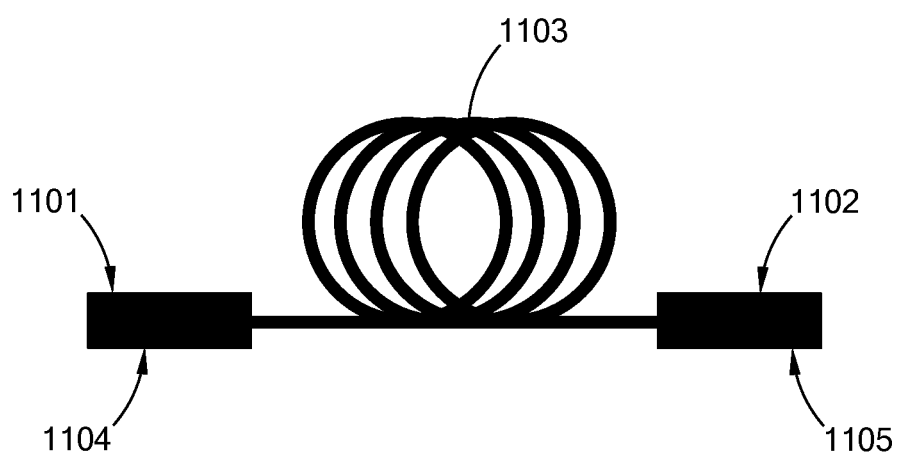
FIG. 11 is a cross section schematic view of an embodiment of an embodiment where the reflective members are dielectric coatings in accordance with the present inventions.

Turning to FIG. 11 there is shown a cross section view of an embodiment of a laser resonator for generating a laser beam in the wavelength region of about 400 to about 700 nm. The laser resonator has an end cap 1104 having a dielectric coating at the 1$^{st}$ Raman order AR at the pump wavelength, a second end cap 1105 having a dielectric coating at the 1$^{st}$ Raman order 1102, R<95% HR at the pump wave length, and a fiber 1103 connect to the end caps and placing the end caps in optical communication.

In an embodiment the second reflective member is a Bragg grating that is capable of, and provides feedback to the first Raman order.

In another embodiment two end caps are utilized on either ends of the fiber. In this embodiment, as in the FIG. 10 embodiment the face of an end cap has a dielectric coating forming a reflective member. The face of the second end cap also has a dielectric coating forming the second reflective member. The dielectric coatings on the faces of the end caps can be a narrow band dielectric coating that does not provide feedback to the second Raman order or any other Raman orders from n>1 to xx. It can be a narrowband dielectric coating that provides feedback to the first Raman order, and is a low reflective coating at the pump wavelength. It can have both reflective members being dielectric coatings and providing feedback to the first Raman order, and which preferable are both low reflective coatings at the pump wavelength. It can have both reflective coatings being dielectric coatings and have the first dielectric coating have low reflectivity for the pump wavelength, and the second dielectric coating have high reflectivity for the pump wavelength, which provides a second pass for the pump wavelength through the resonator to improve the conversion efficiency of the laser.

In an embodiment of the present inventions there is provided a fiber laser using a Bragg grating to provide feedback to the first Raman order of the fiber laser, but not to the second.

In an embodiment of the present inventions there is provided a fiber laser using a Bragg grating to provide feedback to the first Raman order of the fiber laser, but not to the second, created in the optical fiber using femtosecond pulses to operate in the wavelength region of 400-700 nm.

In an embodiment of the present inventions there is provided a fiber laser using a Bragg grating to provide feedback to the first Raman order of the fiber laser, but not to the second, created in a pure fused silica core fiber.

In an embodiment of the present inventions there is provided a fiber laser using a Bragg grating to provide feedback to the first Raman order of the fiber laser, but not to the second, created in a phosphorous doped core fiber.

In an embodiment of the present inventions there is provided a fiber laser using a Bragg grating to provide feedback to the first Raman order of the fiber laser, but not to the second created in a doped core.

In an embodiment of the present inventions there is provided a fiber laser using a Bragg grating to provide feedback to the first Raman order of the fiber laser, but not to the second, where the core is not doped with a photosensitive dopant, e.g., geranium, when used at wavelengths below 500 nm.

In an embodiment of the present inventions there is provided a fiber laser using a Bragg grating to provide feedback to the first Raman order of the fiber laser, but not to the second, where the grating is inscribed at normal incidence to the optical wave direction in the optical fiber to provide feedback within the core of the optical fiber.

In an embodiment of the present inventions there is provided a fiber Bragg grating that provides feedback at a specific wavelength within the Raman gain spectrum.

In an embodiment of the present inventions there is provided fiber Bragg grating that provides feedback over the entire Raman gain spectrum of the first Raman order.

In an embodiment of the present inventions there is provided a fiber Bragg grating to provide loss to the second Raman order.

In an embodiment of the present inventions there is provided a fiber Bragg grating that is inscribed at an angle with respect to the normal of the optical wave direction in the optical fiber to redirect the propagating mode out of the core of the fiber.

In an embodiment of the present inventions there is provided a fiber Bragg grating that is inscribed with a curved shape, e.g., convex, with respect to the normal of the optical wave direction in the optical fiber to redirect only n modes back into the core of the fiber, where n can vary from 1 to <4.

In an embodiment of the present inventions there is provided a fiber Bragg grating that is created in a pure fused silica core fiber.

In an embodiment of the present inventions there is provided a fiber Bragg grating that is created in a phosphorous doped core of a fiber.

In an embodiment of the present inventions there is provided a fiber Bragg grating that is created in a doped core.

In an embodiment of the present inventions there is provided a fiber Bragg grating, where the core is not doped with photosensitive dopants when used at wavelengths below 500 nm.

In an embodiment of the present inventions there is provided a fiber Bragg grating that provides loss over n Raman orders, where n can vary from 2 to >10.

In an embodiment of the present inventions there is provided a fiber-coupled volume Bragg grating that is created using femtosecond pulses to operate in the wavelength region of 400-700 nm.

In an embodiment of the present inventions there is provided a fiber-coupled volume Bragg grating that is created in glass.

In an embodiment of the present inventions there is provided a fiber-coupled volume Bragg grating, that is inscribed at normal incidence to the optical wave direction in glass to provide feedback within the core of the optical fiber.

In an embodiment of the present inventions there is provided a fiber-coupled volume Bragg grating that provides feedback at a specific wavelength within the Raman gain spectrum.

In an embodiment of the present inventions there is provided a fiber-coupled volume Bragg grating that provides feedback over the entire Raman gain spectrum.

In an embodiment of the present inventions there is provided a fiber-coupled volume Bragg grating to provide loss to the second Raman order.

In an embodiment of the present inventions there is provided a fiber-coupled volume Bragg grating that is inscribed at an angle with respect to the normal of the optical wave direction in the optical fiber to redirect the propagating mode out of the core of the fiber.

In an embodiment of the present inventions there is provided a fiber-coupled volume Bragg grating that is inscribed with a curved shape with respect to the normal of the optical wave direction in the optical fiber to redirect only n modes back into the core of the fiber, where n can vary from 1 to <4.

In an embodiment of the present inventions there is provided a fiber-coupled volume Bragg grating that is created in glass.

In an embodiment of the present inventions there is provided a fiber-coupled volume Bragg grating, where the glass is not doped with photosensitive dopants when used at wavelengths below 500 nm.

In an embodiment of the present inventions there is provided a fiber-coupled volume Bragg grating that provides loss over n Raman orders where n can vary from 1 to >10.

In an embodiment of the present inventions there is provided a volume Bragg grating is created using femtosecond pulses to operate in the wavelength region of 400-700 nm.

In an embodiment of the present inventions there is provided a volume Bragg grating written into a fiber optic end cap is created in glass.

In an embodiment of the present inventions there is provided a volume Bragg grating written into a fiber optic end cap, that is inscribed in glass at normal incidence to the optical wave direction and curved to match the NA of the optical fiber to provide feedback within the core of the optical fiber.

In an embodiment of the present inventions there is provided a volume Bragg grating written into a fiber optic end cap that provides feedback at a specific wavelength within the Raman gain spectrum.

In an embodiment of the present inventions there is provided a volume Bragg grating written into a fiber optic end cap that provides feedback over the entire Raman gain spectrum.

In an embodiment of the present inventions there is provided a volume Bragg grating written into a fiber optic end cap to provide loss to the second Raman order.

In an embodiment of the present inventions there is provided a volume Bragg grating written into a fiber optic end cap that is inscribed at an angle with respect to the normal of the optical wave direction in the optical fiber to redirect the propagating mode out of the core of the fiber.

In embodiments of the present inventions there are provided fiber Bragg gratings, volume Bragg gratings, space gratings (such as a moth eye grating) and end caps having Bragg gratings, that have one or more of the following features:

that is created in glass; where the glass is not doped with photosensitive dopants when used at wavelengths below 500 nm; that provides loss over n Raman orders where n can vary from 2 to >10; that is created using femtosecond pulses to operate in the wavelength region of 400-700 nm; is created at normal incidence to the optical wave direction in glass to provide feedback within the core of the optical fiber; that provides feedback at a specific wavelength within the Raman gain spectrum; that provides feedback over the entire Raman gain spectrum; that provides loss to the second Raman order; and that is inscribed at an angle with respect to the normal of the optical wave direction in the optical fiber to redirect the propagating mode out of the core of the fiber.

The use of a femto second laser to create the FBG is a preferred method of creating the wavelength specific index of refraction changes in the fiber to form the monolithic fiber laser resonator, it is recognized that other methods may be employed or later developed. For example, the FBG can be induced by deep UV radiation provided by excimer lasers, exposure of the optical to fiber to X-rays, or any other method to modify the index of refraction of the of the optical fiber to create a FBG to operate in visible portion of the spectrum.

There are several commercially available femtosecond lasers that can be used to create a laser affected zone in an optical fiber, and to form a VBG, a FBG, and other areas changed index of refraction optical fiber material. It is believed that laser beams having pulse widths of less than about 10 pico second, less than about 5 pico seconds, less than about 1 pico second, less than about 500 femto seconds, and less than about 100 femto seconds can be used to create a laser affected zone.

The following examples are provided to illustrate various embodiments of LAM systems, LAM methods, and Raman oscillator lasers of the present inventions. These examples are for illustrative purposes and should not be viewed as, and do not otherwise limit the scope of the present inventions.

EXAMPLE 1

A laser cabinet has a power conditioning source, a pump laser, 10 monolithic fiber lasers, a beam combiners and associated control systems, safety interlocks and monitors, and a cooling systems (e.g., a fan, heat sink, or separate cooling system such as a chiller). The power conditioning source powers a semiconductor laser pump source, having a wavelength of 445 nm, and a power of 400 Watts the laser pump source provide a pump laser beam to 10 monolithic fiber laser resonators having FBG as the terminus of the laser resonator. Each monolithic fiber laser resonator produces an initial laser beam having a wavelength of 453 nm and a power of 200 Watts. Each initial laser beam is combined by a glass beam combiner to product an output laser beam having a 2000 Watts with diffraction limited up to highly multi-mode beam quality.

It is noted that there is no requirement to provide or address the theory underlying the novel and groundbreaking processes, materials, performance or other beneficial features and properties that are the subject of, or associated with, embodiments of the present inventions. Nevertheless, various theories are provided in this specification to further advance the art in this area. The theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the function-features of embodiments of the methods, articles, materials, devices and system of the present inventions; and such later developed theories shall not limit the scope of protection afforded the present inventions.

The various embodiments of systems, equipment, techniques, methods, activities and operations set forth in this specification may be used for various other activities and in other fields in addition to those set forth herein. Additionally, these embodiments, for example, may be used with: other equipment or activities that may be developed in the future; and with existing equipment or activities which may be modified, in-part, based on the teachings of this specification. Further, the various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

The invention claimed is:

1. A laser resonator for generating a laser beam in the wavelength region of about 400 nm to about 700 nm, the laser resonator comprising:
   a) an optical fiber comprising a core and a cladding and having an all fiber feed-back mechanism, the feed-back mechanism comprising a first reflective member and a second reflective member: the first reflective member and the second reflective member located along a length of the optical fiber and defining a distance there between; and,
   b) wherein, the second reflective member is a fiber Bragg grating, wherein the fiber Bragg grating is capable of providing feedback to the first Raman order; and wherein the fiber Bragg grating is incapable of providing feedback to the second Raman order.

2. The laser resonator of claim 1, wherein the fiber Bragg grating is created in the optical fiber using femtosecond pulses to operate in the wavelength region of 400-700 nm.

3. The laser resonator of claim 2, wherein the fiber Bragg grating is inscribed at an angle with respect to the normal of the optical wave direction in the optical fiber; whereby the fiber Bragg grating is capable of redirecting the propagating mode out of the core of the fiber.

4. The laser resonator of claim 2, wherein the fiber Bragg grating is inscribed with a curved shape with respect to the normal of the optical wave direction in the optical fiber; whereby the fiber Bragg grating is capable of redirecting only n modes back into the core of the fiber, where n can vary from 1 to <4.

5. The laser resonator of claim 2, wherein the fiber Bragg grating is inscribed in a pure fused silica core fiber.

6. The laser resonator of claim 2, wherein the fiber Bragg grating is inscribed in a phosphorous doped core of a fiber.

7. The laser resonator of claim 2, wherein the fiber Bragg grating is inscribed in a doped core.

8. The laser resonator of claim 2, wherein the core is not doped with photosensitive dopants, whereby the core is free from photosensitive dopants;
   and the laser resonator is capable of producing a laser beam at wavelengths below about 500 nm.

9. The laser resonator of claim 1, wherein the core is pure fused silica core and the fiber Bragg grating is located in the core.

10. The laser resonator of claim 1, wherein the core is a phosphorous doped core and the fiber Bragg grating is located in the core.

11. The laser resonator of claim 1, wherein the core is not doped with photosensitive dopants, whereby the core is free from photosensitive dopants; and the laser resonator is capable of producing a laser beam at wavelengths below about 500 nm.

12. The laser resonator of claims 11, wherein the fiber Bragg grating is a fiber-coupled volume Bragg grating.

13. The laser resonator of claim 1, wherein the fiber Bragg grating is inscribed at normal incidence to the optical wave direction in the optical fiber;
   thereby providing feedback within the core of the optical fiber.

14. The laser resonator of claim 1, wherein the fiber Bragg grating is a fiber-coupled volume Bragg grating; and wherein the fiber-coupled volume Bragg grating is created using femtosecond laser pulses.

15. The laser resonator of claim 1, wherein the fiber Bragg grating is a fiber-coupled volume Bragg grating; and wherein the fiber-coupled volume Bragg grating is created in glass.

16. The laser resonator of claim 1, wherein the fiber Bragg grating is a fiber-coupled volume Bragg grating; and wherein the fiber-coupled volume Bragg grating is inscribed at normal incidence to the optical wave direction in glass; whereby the fiber-coupled volume Bragg grating is capable of providing feedback within the core of the optical fiber.

17. The laser resonator of claims 1, wherein the fiber Bragg grating is a fiber-coupled volume Bragg grating; wherein the fiber-coupled volume Bragg grating is inscribed at an angle with respect to the normal of the optical wave direction in the optical fiber; whereby the fiber-coupled Bragg grating is capable of redirecting the propagating mode out of the core of the fiber.

18. The laser resonator of claims 1, wherein the fiber Bragg grating is a fiber-coupled volume Bragg grating; wherein the fiber-coupled volume Bragg grating is inscribed with a curved shape with respect to the normal of the optical wave direction in the optical fiber; whereby the fiber-coupled Bragg grating is capable of redirecting only n modes back into the core of the fiber, where n can vary from 1 to <4.

19. The laser resonator of claim 1 comprises a fiber optic endcap, and wherein the Bragg grating is located in the fiber optic endcap.

* * * * *